United States Patent
Lee et al.

(10) Patent No.: US 8,253,423 B2
(45) Date of Patent: Aug. 28, 2012

(54) MULTIPLE LINE WIDTH ELECTROMIGRATION TEST STRUCTURE AND METHOD

(75) Inventors: Chii-Chang Lee, Singapore (SG); Jeremy Martin, North Potomac, MD (US)

(73) Assignee: GlobalFoundries Inc., Grand Cayman (KY)

( * ) Notice: Subject to any disclaimer, the term of this patent is extended or adjusted under 35 U.S.C. 154(b) by 1456 days.

(21) Appl. No.: 11/772,310

(22) Filed: Jul. 2, 2007

(65) Prior Publication Data
US 2009/0012747 A1   Jan. 8, 2009

(51) Int. Cl.
*G01R 31/02* (2006.01)
*G01R 31/26* (2006.01)
(52) U.S. Cl. .................. 324/537; 324/762.01
(58) Field of Classification Search .......... None
See application file for complete search history.

(56) References Cited

U.S. PATENT DOCUMENTS
5,497,076 A * 3/1996 Kuo et al. ............ 324/762.02
7,176,485 B2 * 2/2007 Leidy .................... 257/48

FOREIGN PATENT DOCUMENTS
WO    WO 97/10614    3/1997

* cited by examiner

*Primary Examiner* — Roberto Velez
(74) *Attorney, Agent, or Firm* — Ditthavong Mori & Steiner, P.C.

(57) ABSTRACT

Apparatus and methods pertaining to examining electromigration lifespan are disclosed. In one aspect, a method of manufacturing is provided that includes forming a test structure on a semiconductor substrate. The test structure includes a first conductor structure that has a first cross-sectional area and a second conductor structure that has a second cross-sectional area larger than the first cross-sectional area. Current is flowed through the first and second conductor structures at current densities sufficient to cause electromigration in the first and second conductor structures. The current is monitored for drops indicative of electromigration failure of one or both of the first and second conductor structures. The time elapsed before the failure of the one or both of the conductor structures is recorded.

15 Claims, 4 Drawing Sheets

MULTIPLE LINE WIDTH ELECTROMIGRATION TEST STRUCTURE AND METHOD

BACKGROUND OF THE INVENTION

1. Field of the Invention

This invention relates generally to semiconductor processing, and more particularly to methods and apparatus for predicting electromigration lifespan of conductor structures.

2. Description of the Related Art

Conventional semiconductor devices typically include a semiconductor substrate, a plurality of insulating and conductive levels formed thereon having a conductive interconnection pattern comprising features and spacings, such as a plurality of spaced apart conductive lines, and several types of conductive interconnection lines, such as bus lines, power supply lines and clock lines. The various conductor lines may have linewidths at or above the minimum widths specified in the design rules of the semiconductor device.

A limitation on the lifetime and reliability of conventional semiconductor devices attributed to conductive interconnection lines is due to electromigration. The phenomenon of electromigration involves the flow of electrons causing the migration of atoms, thereby generating voids and hillocks. The formation of voids creates an opening in a conductive interconnection line, thereby decreasing the performance of the interconnection line. The formation of voids generates areas of increased resistance which undesirably reduce the speed of a semiconductor device. The voids may eventually span the entire cross-section of a line and lead to an open circuit. Thus, electromigration constitutes a limitation on the lifetime of a conductive interconnection line as well as the performance of the semiconductor device.

Electromigration in a metal interconnection line can be characterized by the movement of ions induced by a high electrical current density. The continual miniaturization of feature sizes of semiconductor devices increases current density, which can causes an attendant increase in electromigration induced metallization failures.

The basic physics of electromigration behavior for small conductor lines is relatively well known. The specific lifetime for a given integrated manufacturing process is measured during the technology qualification, which must be completed prior to the start of manufacturing. Accordingly, chip designers create design rules for conductor lines that take into consideration electromigration lifespan. However, there remains the need to verify the electromigration assumptions built into design rules. The verification is always done prior to fully qualifying a wafer design for commercial production. However, subsequent testing is frequently done to verify the impacts of, for example, the use of a new lithography or material deposition tool in wafer processing.

A conventional technique uses test structures built into a semiconductor wafer. In one conventional variation, scanning electron microscopy is used to examine line widths of the test structure and a comparison is then made with the design rule. Subsequently the test structure is physically tested to examine electromigration lifespan. This discrete test structure is built to model each conductor line width. The test structures are often built into the scribe lines of a wafer. At the stage of wafer dicing, the test structures are cut out as so-called chiplets. The chiplets are then mounted in a package of one sort or another and then subjected to electromigration testing. To simulate in a reasonable time period the electromigration lifespan of a conductor of a given line width that may last many years, the chiplet is subjected to highly elevated temperatures and current densities for a period of hours or weeks. The time to failure in hours or weeks is then extrapolated out to the actual multi-year lifespan of the modeled conductor line.

A difficulty associated with the first conventional technique is that scanning electron microscopy may not be able to accurately resolve very fine line widths. Certain inefficiency issues are associated with the second conventional technique since discrete chiplets are used for each conductor line width. This requires more chip area and more complex testing of larger numbers of chiplets.

The present invention is directed to overcoming or reducing the effects of one or more of the foregoing disadvantages.

SUMMARY OF THE INVENTION

In accordance with one aspect of the present invention, a method of manufacturing is provided that includes forming a test structure on a semiconductor substrate. The test structure includes a first conductor structure that has a first cross-sectional area and a second conductor structure that has a second cross-sectional area larger than the first cross-sectional area. Current is flowed through the first and second conductor structures at current densities sufficient to cause electromigration in the first and second conductor structures. The current is monitored for drops indicative of electromigration failure of one or both of the first and second conductor structures. The time elapsed before the failure of the one or both of the conductor structures is recorded.

In accordance with another aspect of the present invention, a method of manufacturing is provided that includes forming a test structure on a semiconductor substrate external to chip areas of the semiconductor substrate. The test structure includes a first conductor structure, a second conductor structure and a plurality of conductor lines electrically connected between the first and second conductor structures. A first of the conductor lines has a first cross-sectional area and the other conductor lines have successively larger cross-sectional areas. Current is flowed through the plurality of conductor lines at current densities in the plurality of conductor lines sufficient to cause electromigration. The current is monitored for drops indicative of electromigration failure of one or more of the plurality of conductor lines. The time elapsed before the failure of the one or more of the plurality of conductor lines is recorded.

In accordance with another aspect of the present invention, a method of modeling electromigration lifespan of a plurality of conductor lines on a semiconductor substrate having chip areas is provided. The method includes forming a test structure on the semiconductor substrate wherein the test structure includes a first conductor, a second conductor and a plurality of conductor lines electrically connected between the first and second conductors. A first of the conductor lines has a first cross-sectional area and the other conductor lines have successively larger cross-sectional areas. The first and the successively larger cross-sectional areas match respective cross-sectional areas of a plurality of conductor lines in at least one of the chip areas of the semiconductor substrate. Current is flowed through the plurality of conductor lines at current densities in the plurality of conductor lines sufficient to cause electromigration. The current is monitored for drops indicative of electromigration failure of one or more of the plurality of conductor lines. The time elapsed before the failure of the one or more of the plurality of conductor lines is recorded. The time elapsed before failure of the one or more of the plurality of conductor lines is extrapolated to an electromigration lifespan of one or more of the plurality of conductor lines in the at least one chip area.

In accordance with another aspect of the present invention, an apparatus is provided that includes a semiconductor substrate that has a plurality of chip areas and a test structure on a semiconductor substrate external to chip areas. The test structure includes a first conductor, a second conductor and a plurality of conductor lines electrically connected between the first and second conductors. A first of the conductor lines has a first cross-sectional area and the other conductor lines having successively larger cross-sectional areas.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
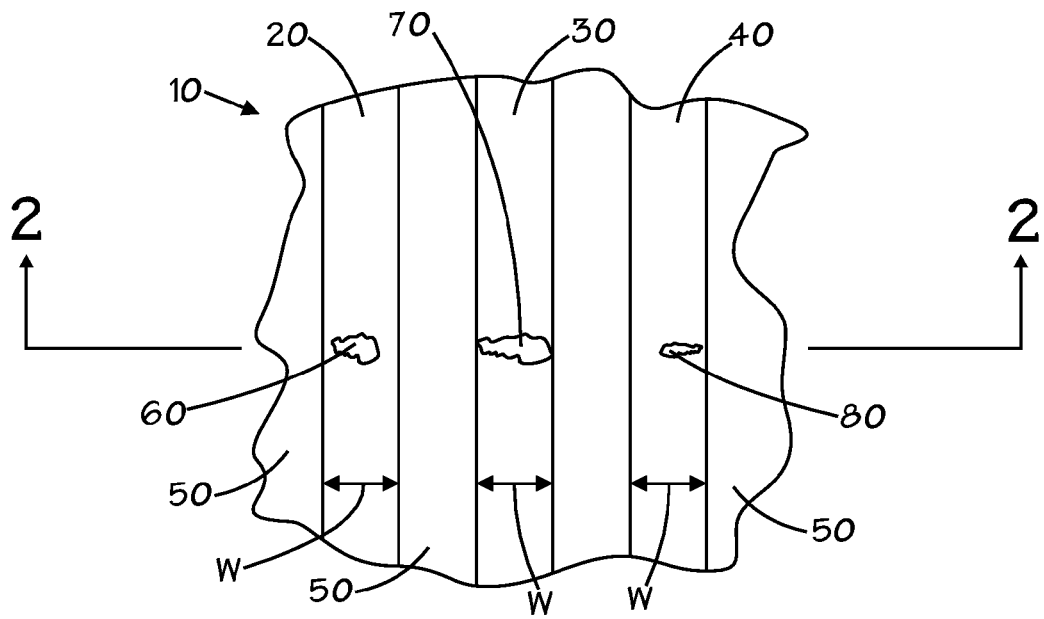
FIG. 1 is an overhead view of a conventional collection of conductor lines following electromigration void formation.

In the drawings described below, reference numerals are generally repeated where identical elements appear in more than one figure. Turning now to the drawings, and in particular to FIG. 1, therein is shown an overhead view of a small portion of an exemplary conventional integrated circuit 10 that includes three spaced-apart conductor lines 20, 30 and 40 that are segregated laterally by a dielectric layer 50. As a result of electromigration, respective voids 60, 70 and 80 have formed in the conductor lines 20, 30 and 40. Each of the conductor lines 20, 30 and 40 has a width W. The void 60 spans a significant portion of the width W of the line 20. The void 70 spans the entire width W of the line 30 and the void 80 spans some portion of the width W of the line 40.

Figure 2:
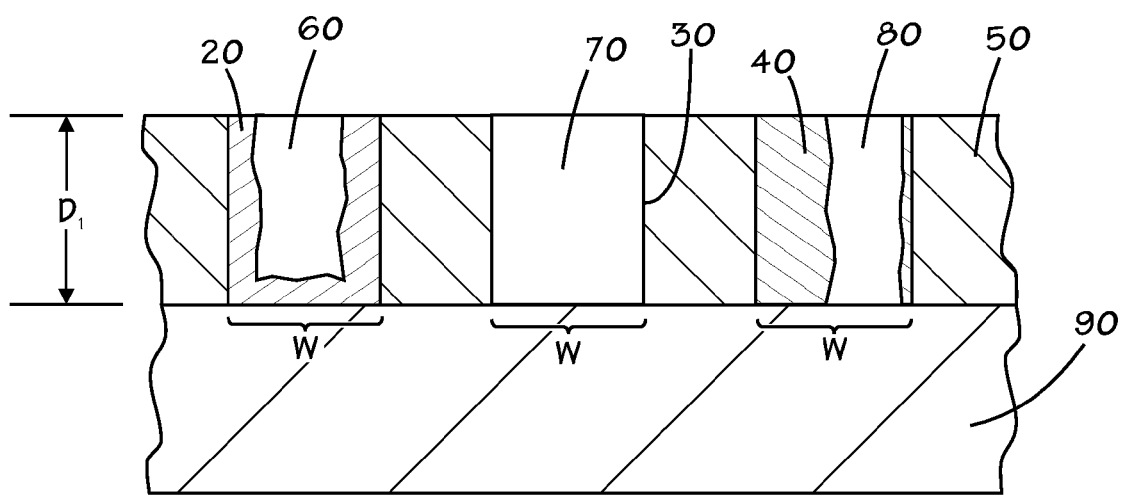
FIG. 2 is a sectional view of FIG. 1 taken at section 2-2.

Additional detail regarding the conductor lines 20, 30 and 40 may be understood by referring now to FIG. 2, which is a sectional view of FIG. 1 taken at section 2-2. The lines 20, 30 and 40 and the dielectric layer 50 may be formed on an underlying substrate 90 of dielectric or semiconductor material. The lines 20, 30 and 40 all have the same thickness $D_1$ and width W as noted above. Note that the void 60 spans a significant portion of the width W of the line 20 but not the entire depth $D_1$ thereof. Accordingly, a portion of the line 20 is still available for the transmission of current. In contrast, the line 30 is completely severed by the void 70 both horizontally and vertically and thus an open circuit condition exists for line 30. As to line 40, the void 80 is shown extending from top to bottom but only laterally through approximately half of the line 30. Accordingly, about half of the line 40 is still available for the transmission of current. The current density for each of the lines 20, 30 and 40 is given by:

$$i_{density} = \frac{i}{A} \quad (1)$$

where i is the current in a line 20, 30 or 40 and A is the cross-sectional area through which the current i flows. In the absence of electromigration effects, the area A is given by:

$$A = W \times D_1 \quad (2)$$

However, in reality the presence of the voids 60, 70 and 80 reduces, or eliminates in the case of the void 70, the available current flow cross-sectional area. As a result, the actual current density for the line 20 is significantly higher than it would be but for the presence of the void 60. The same is true for the line 40 due to the presence of the void 80. With regard to the line 30, the open circuit yields a current density of zero.

As discussed in the Background section hereof, the conventional method of characterizing the electromigration lifetime of a conductor line in an integrated circuit, involves the initial fabrication of a plurality of test structures on a semiconductor wafer, where each of the test structures is typically dedicated to a particular line width. A dicing operation is performed to cut out individual chiplets that contain the test structures and the chiplets are next mounted in some form of package that can be connected to a testing computer. The chiplets are then subjected to accelerated temperature and current conditions in order to simulate an electromigration lifetime for the individual test structures and the actual conductor lines that those test structures are designed to model.

Figure 3:
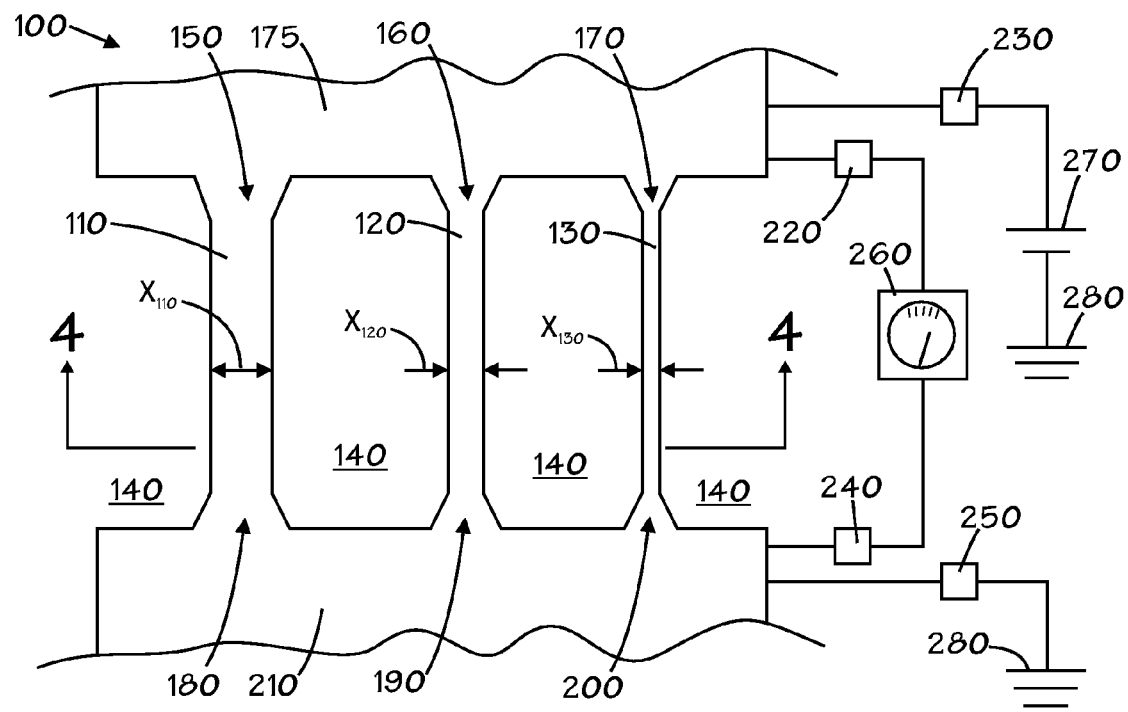
FIG. 3 is an overhead view of an exemplary embodiment of a test structure for modeling electromigration lifespan.

An exemplary embodiment of a test structure 100 may be understood by referring now to FIG. 3, which is an overhead view. The test structure 100 includes three spaced-apart conductor structures 110, 120 and 130 that are separated and electrically isolated laterally by an insulating layer 140. The conductor structures 110, 120 and 130 may be fabricated as lines or stripes or some other geometry. The lines 110, 120 and 130 may be formed by etching or otherwise forming trenches in the insulating layer 140 and thereafter depositing material in the trenches. Optionally, the lines 110, 120 and 130 may be formed first by material deposition and shaping and the insulating layer 140 thereafter. The conductor lines are designed to model the electromigration life span of integrated circuit conductor lines. Accordingly, the lines 110, 120 and 130 may be composed of various conductive metals, such as aluminum, aluminum alloys, copper, copper alloys, silver, silver alloys, gold, gold alloys, refractory metals, refractory metal compounds and refractory metal alloys. The insulating layer 140 may be composed of silicon dioxide, silicon oxynitride, low-K dielectrics, TEOS, polymeric materials or the like.

A goal of the test structure 100 is to provide electromigration life span modeling of conductor lines in actual circuitry for several line widths using a single test structure. Accordingly, the conductor lines 110, 120 and 130 are fabricated with respective lateral dimensions $X_{110}$, $X_{120}$ and $X_{130}$ where $X_{120}$ is less than $X_{110}$ and $X_{130}$ is less than $X_{120}$. If desired, the smallest line width $X_{130}$ may be selected to match the critical dimension for a given process technology. Furthermore, the dimensions $X_{110}$ and $X_{120}$ of the larger conductor lines 110 and 120 may be selected to be simple multiples of the smallest dimension $X_{130}$. For example, the dimensions $X_{110}$ and $X_{120}$ may be given by:

$$X_{110} = 1.5 \times X_{130} \quad (3)$$

and $$X_{120} = 1.25 \times X_{130} \quad (4)$$

The number of conductor lines can vary from two to virtually any number and the line widths thereof may or may not be multiples of the smallest line 30.

The respective ends 150, 160 and 170 of the conductor lines 110, 120 and 130 are tied in parallel to a relatively larger conductor structure 175. The conductor structure 175 is advantageously relatively large compared to the conductor lines 110, 120 and 130 in order to provide a relatively low resistance pathway to and from the ends 150, 160 and 170 of the lines 110, 120 and 130. The opposite ends 180, 190 and 200 of the conductor lines 110, 120 and 130 are tied in parallel to another large conductor structure 210 for the same reasons, albeit at a location opposite the location of the large conductor structure 175. Bond pads 220 and 230 may be electrically connected to the conductor structure 175 and bond pads 240 and 250 may be connected to the conductor structure 210. It is desirable for the bond pads 220, 230, 240 and 250 to provide low resistance ohmic contacts. It should be understood that the bonds pads 220, 230, 240 and 250 may be significantly larger in area relative to the conductor lines 110, 120 and 130 than shown in order to provide the desired low resistance.

A current sensing instrument 260 may be connected to the bond pads 220 and 240 in order to sense the current flowing through the conductor lines 110, 120 and 130. Similarly, in order to establish a flow of current, a voltage source 270 may be connected to the bond pad 30 and a ground 280 may be connected to the bond pad 250 to establish a requisite potential difference to cause current to flow through the conductor lines 110, 120 and 130. The current sensing instrument 260, the voltage source 270 and the ground 280 may be part of an external instrument or system that is operable to electrically stimulate the test structure 100.

Figure 4:
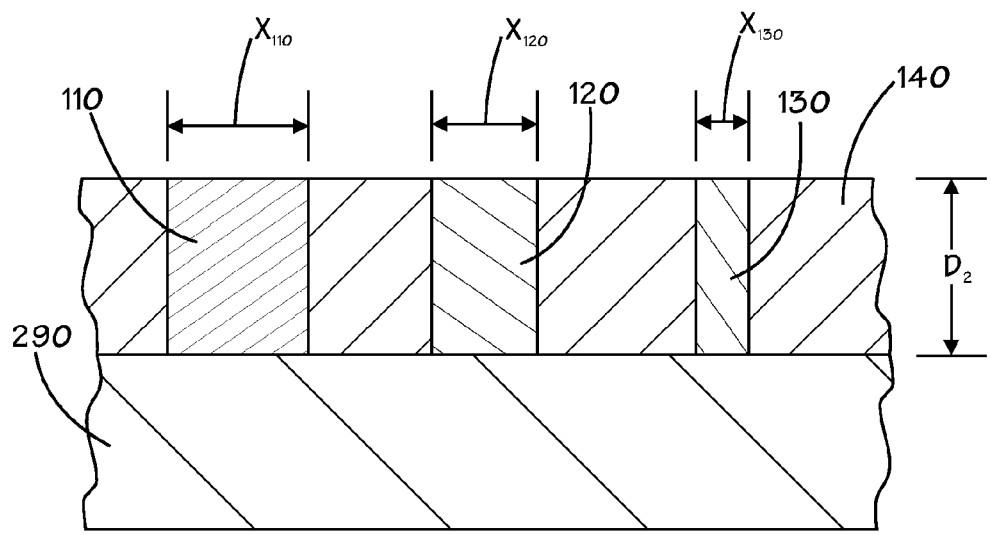
FIG. 4 is a sectional view of FIG. 3 taken at section 4-4.

Additional detail regarding the structure of the conductor lines 110, 120 and 130 may be understood by referring now also to FIG. 4, which is a sectional view of FIG. 3 taken at section 4-4. In addition to having respective lateral dimensions $X_{110}$, $X_{120}$ and $X_{130}$, the conductor lines 110, 120 and 130 may, but need not all have the same depth $D_2$. However, the benefits of the disclosed embodiments may be realized where the cross-sectional areas of the conductor lines 110, 120 and 130 match up with the cross-sectional areas of conductor lines in active circuitry. The conductor lines 110, 120 and 130 are positioned on another layer 290, which may be a dielectric layer or virtually any other type of layer. However, if the test structure 100 is implemented on a semiconductor wafer, the layer 290 may be an interlevel dielectric layer or metallization layer as desired.

Figure 5:
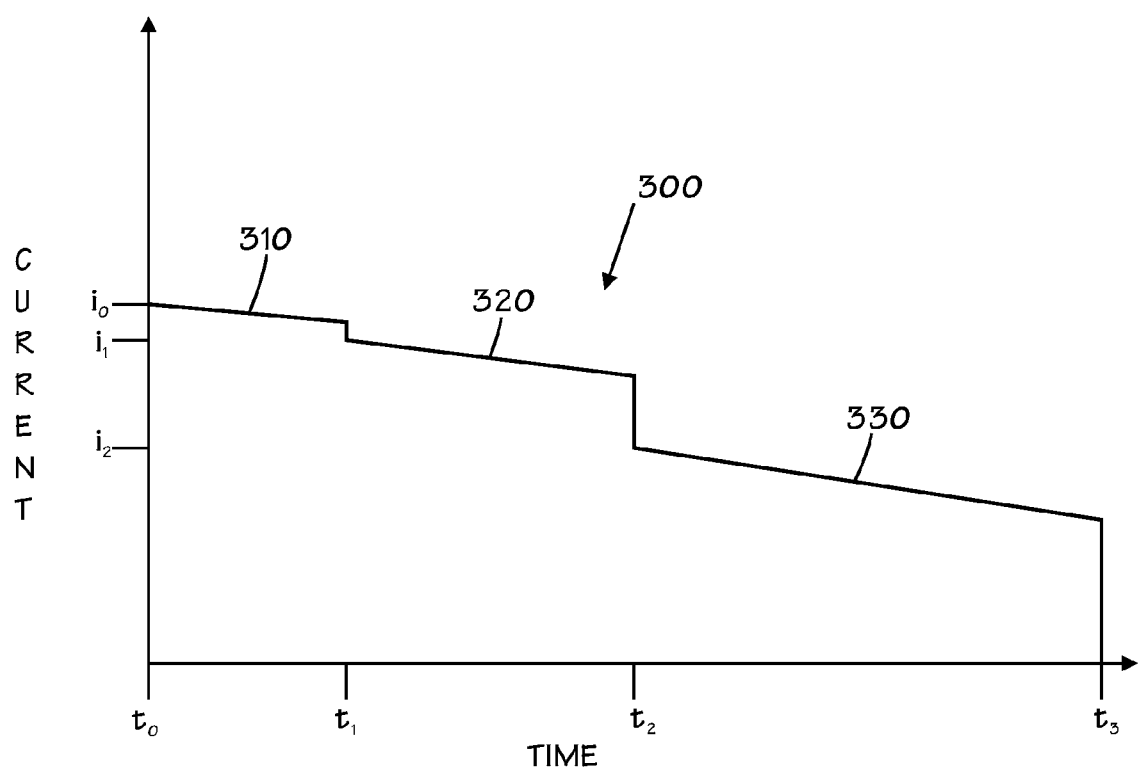
FIG. 5 is an exemplary plot of current versus time for an exemplary test performed using the exemplary test structure depicted in FIGS. 3 and 4.

An exemplary method of using the test structure 100 may be understood by referring now to FIGS. 3 and 5. FIG. 5 is a plot 300 of current versus time for the test structure 100 during an electromigration test. During the test, the test structure 100 is biased and subjected to temperature levels and current densities sufficient to produce electromigration failure in a matter of hours or weeks so that the lifespans of the conductor lines 110, 120 and 130 may be used to extrapolate to the actual electromigration lifespans of integrated circuit conductor lines in actual parts. The voltage and temperature levels should be low enough to avoid instantaneous failures but high enough to avoid excessively long test runs. Mathematically speaking and referring to FIG. 5, at a time $t_0$ a voltage V with respect to the ground 280 is applied between the bond pads 230 and 250 by way of the voltage source 270. The potential difference V is advantageously substantially constant. At time $t_0$ a current $i_0$ flows through the combination of the conductor lines 110, 120 and 130. The portion of the plot 300 labeled 310 corresponds to the time period $t_1-t_0$, and represents the electromigration lifespan of the conductor line 130. Note that at time $t_1$, the current takes a sudden drop from slightly less than $i_0$ to $i_1$. This sudden drop in current is indicative of the electromigration failure of the line 130. Note also that the portion 310 of the plot 300 in the period $t_1-t_0$ has a negative slope, which is reflective of the fact that the resistance of the combination of the lines 110, 120 and 130 increases progressively due to electromigration in all of the lines 110, 120 and 130. During the time period $t_1$ to $t_2$, the current continues to decrease due to the previously described resistance increase phenomena. At time $t_2$, the current takes another precipitous drop from slightly less than $i_1$ to $i_2$. The precipitous drop at $t_2$ represents the electromigration failure of the next wider line 120. Accordingly, the electromigration lifespan of the line 120 is given by $t_2-t_0$. The portion of the plot 330 from $t_2$ to $t_3$ represents current flowing through the remaining line 110. As with the other portions 310 and 320 of the plot 300, the portion 330 also has a negative slope due to the aforementioned resistance increase phenomena. At time $t_3$, the current drops from slightly less than $i_2$ to zero as a result of the ultimate electromigration failure of the line 110. The time period $t_3-t_0$ represents the electromigration lifespan of the line 110. The test need not be run to failure of all of the conductor lines 110, 120 and 130.

From a qualitative standpoint, it is a relatively safe assumption that, on average, the thinnest conductor line 130 will fail first, followed in succession by the progressively larger lines 120 and 110. However, the data of the plot 300 can be easily interpreted to verify which of the lines 110, 120 and 130 fail and when, if the areas $A_{110}$, $A_{120}$ and $A_{130}$ of the conductor lines 110, 120 and 130 are known. The total current density area $A_{total}$ is given by:

$$A_{total} = A_{110} + A_{120} + A_{130} \tag{5}$$

The ratio of current in given line 110, 120 and 130 to the total current is the same as the ratio of the area $A_{110}$, $A_{120}$ or $A_{130}$ of a given line 110, 120 or 130 to the total area $A_{total}$. For the conductor lines, the ratios of individual areas $A_{110}$, $A_{120}$ or $A_{130}$ to $A_{total}$ are given by:

$$\frac{A_{110}}{A_{total}} = \frac{A_{110}}{A_{110} + A_{120} + A_{130}} \tag{6}$$

$$\frac{A_{120}}{A_{total}} = \frac{A_{120}}{A_{110} + A_{120} + A_{130}} \tag{7}$$

$$\frac{A_{130}}{A_{total}} = \frac{A_{130}}{A_{110} + A_{120} + A_{130}} \tag{8}$$

The percentage drop in current drop observed by the operator when a line fails, such as the drop $i_0$ to $i_1$, will be proportional to the loss in total current density area $A_{total}$ for the failed line. The percentage drop in current at time $t_1$ for the current drop $i_0$ to $i_1$ is given by:

$$i_{\% drop @ t_2} \approx \frac{i_0 - i_1}{i_0} \tag{9}$$

Thus, if:

$$i_{\% drop @ t_2} \approx \frac{A_{130}}{A_{total}} \tag{10}$$

is satisfied, then the conductor line failure at time $t_1$ is identified with the conductor line 130. Note that the relationships in Equations 9 and 10 are approximate because the actual current level is somewhat less than exactly $i_0$ at the moment of failure due to the continual sagging in current exhibited by the negatively sloped portion 310 of the plot 300.

The arithmetic is further simplified if all of the conductor lines 110, 120 and 130 have the same depth $D_2$. In that case, the term $D_2$ cancels out of the area terms $A_{130}$ and $A_{total}$ and Equation 10 simplifies to:

$$i_{\%\,drop@t_2} \approx \frac{X_{130}}{X_{total}} \quad (11)$$

where $X_{total}$ is the sum of the line widths $X_{110}$, $X_{120}$ and $X_{130}$. The same analysis will hold true for the remaining conductor lines 120 and 110, however, the ratio of currents will change. Thus, the percentage drop in current at time $t_2$ for the drop $i_1$ to $i_2$ will be given by:

$$i_{\%\,drop@t_2} \approx \frac{i_1 - i_2}{i_1} \quad (12)$$

Figure 6:
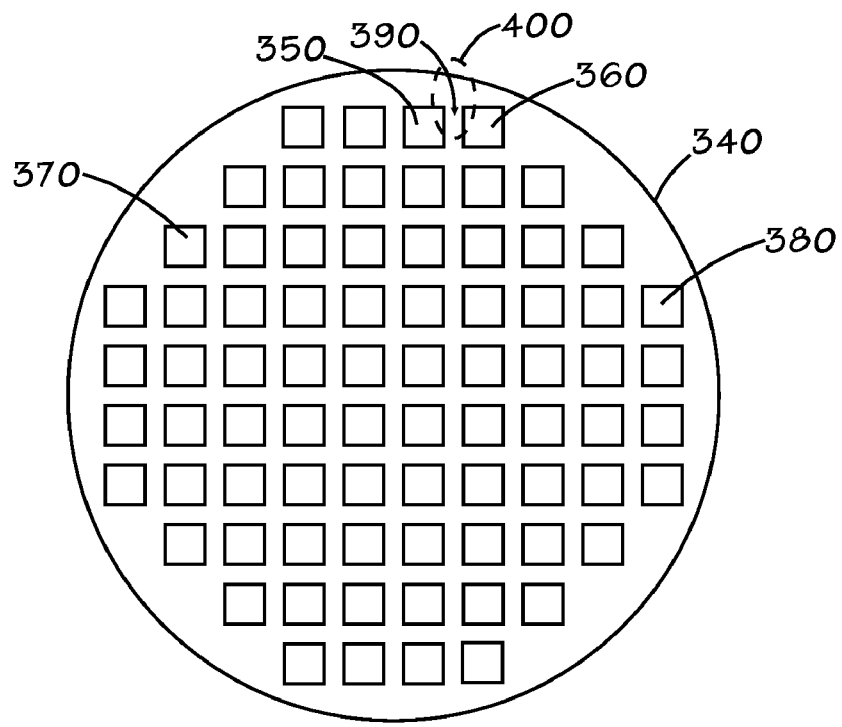
FIG. 6 is an overhead view of an exemplary semiconductor wafer upon which an exemplary electromigration test structure is formed.
Figure 7:
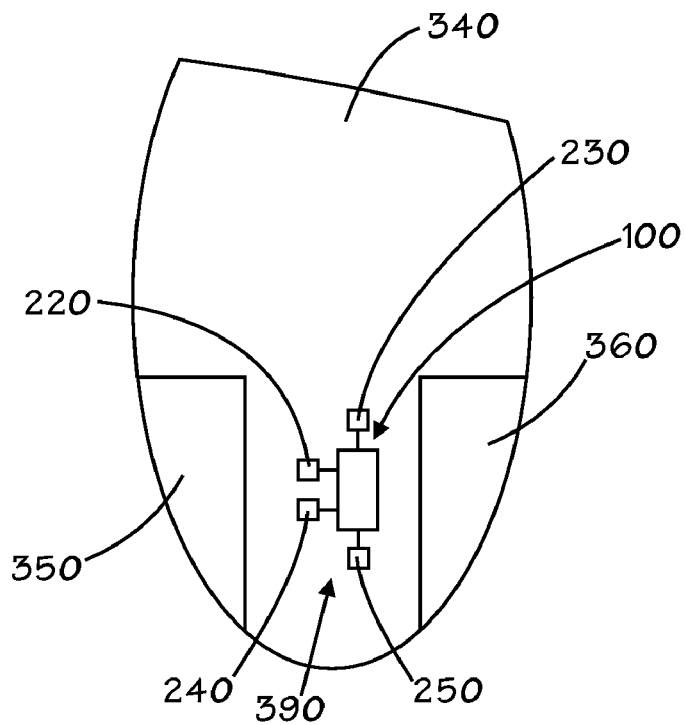
FIG. 7 is a magnified view of a portion of FIG. 6.

The test structure 100 may be fabricated in a variety of locations on a semiconductor structure. An exemplary embodiment is depicted in FIGS. 6 and 7. FIG. 6 is an overhead view of an exemplary semiconductor substrate or wafer 340 that includes a plurality of semiconductor die, four of which are labeled 350, 360, 370 and 380. The areas where die are located may be termed chip regions. Areas external to the chip regions, such as the areas of the wafer 340 between individual die, such as the die 350 and 360 may include scribe lines 390. The dashed oval 400 represents a portion of the wafer 340 that is shown at much greater magnification in FIG. 7. The test structure 100 of the type described above in conjunction with FIGS. 3 and 4, may be located in the scribe line 390 as shown. Exemplary locations of the bond pads 220, 230, 240 and 250 are depicted. It should be understood that the test structure 100 may be located at virtually any location on the semiconductor wafer 340 and at virtually any vertical level of the wafer. For example, the test structure 100 may be located at any metallization layer. Furthermore, multiple test structures may be located on a given level or on multiple levels if desired. The electromigration testing of the test structure 100 may be performed while the test structure is still attached to the wafer 340. Optionally, a portion of the semiconductor wafer 340 containing the test structure may be cut from the wafer 340 and thereafter subjected to electromigration testing, An advantage of the disclosed embodiments is the provision of multiple line widths in a single test structure. With fewer test structures needed to provide electromigration data, less chip area is required. Furthermore, a single electrical test can provide data on multiple line widths.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising: forming a test structure on a semiconductor substrate, the test structure including a first conductor structure having a first cross-sectional area and a second conductor structure having a second cross-sectional area larger than the first cross-sectional area; wherein the first conductor and the second conductor are electrically connected in parallel; flowing current in parallel through the first and second conductor structures at current densities sufficient to cause electromigration in the first and second conductor structures; monitoring the current for drops indicative of electromigration failure of one or both of the first and second conductor structures; and recording the time elapsed before the failure of the one or both of the first and second conductor structures.

2. The method of claim 1, comprising separating a portion of the semiconductor substrate containing the test structure prior to flowing current through the first and second conductor structures.

3. The method of claim 1, wherein first and second conductor structures are formed with respective first and second lateral dimensions and substantially the same depth.

4. The method of claim 1, wherein the flowing current comprises applying a substantially constant potential difference between ends of the first and second conductor structures.

5. The method of claim 1, wherein the monitoring of the current comprises electrically connecting a current sensing instrument to the first and second conductor structures.

6. The method of claim 1, comprising electrically connecting first ends of the first and second conductor structures to a first bond pad and second ends of the first and second conductor structures to a second bond pad.

7. The method of claim 1, wherein the forming of the first and second conductor structures comprises forming first and second trenches in an insulating layer and depositing metal in the first and second trenches.

8. The method of claim 1, wherein the forming of the first and second conductor structures comprises depositing copper.

9. An apparatus, comprising: a semiconductor substrate having a plurality of chip areas; a test structure on a semiconductor substrate external to chip areas, the test structure including a first conductor, a second conductor and a plurality of conductor lines electrically connected in parallel between the first and second conductors, a first of the conductor lines having a first cross-sectional area and the other conductor lines having successively larger cross-sectional areas; wherein current is flowed in parallel through the first and second conductor at current densities sufficient to cause electromigration in the first and second conductors; wherein current drops indicative of electromigration failure of one or both of the first and second conductors is monitored; and the time elapsed before the failure of the one or both of the first and second conductors is recorded.

10. The apparatus of claim 9, wherein the conductor lines have respective lateral dimensions and substantially the same depth.

11. The apparatus of claim 9, comprising a voltage source electrically connected to the first and second conductors.

12. The apparatus of claim 9, comprising a current sensing instrument electrically connecting to the first and second conductor structures.

13. The apparatus of claim 9, comprising a first bond pad electrically connected to the first conductor structure and a second bond pad electrically connected to the second conductor structure.

14. The apparatus of claim 9, wherein the plurality of conductor lines comprises a plurality of metallic lines positioned in a respective plurality of trenches in an insulating layer.

15. The apparatus of claim 14, wherein the metallic lines comprise copper.

* * * * *